United States Patent
Lin et al.

(10) Patent No.: US 10,049,939 B2
(45) Date of Patent: Aug. 14, 2018

(54) SEMICONDUCTOR DEVICE AND A METHOD FOR FABRICATING THE SAME

(71) Applicant: TAIWAN SEMICONDUCTOR MANUFACTURING CO., LTD., Hsinchu (TW)

(72) Inventors: Meng-Han Lin, Hsinchu (TW); Chih-Ren Hsieh, Changhua (TW); Chen-Chin Liu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/216,569

(22) Filed: Jul. 21, 2016

(65) Prior Publication Data

US 2018/0005897 A1 Jan. 4, 2018

Related U.S. Application Data

(60) Provisional application No. 62/356,965, filed on Jun. 30, 2016.

(51) Int. Cl.
*H01L 21/28* (2006.01)
*H01L 21/762* (2006.01)
*H01L 21/8234* (2006.01)
*H01L 29/423* (2006.01)

(52) U.S. Cl.
CPC ........ *H01L 21/823462* (2013.01); *H01L 21/28158* (2013.01); *H01L 21/76224* (2013.01); *H01L 29/42364* (2013.01)

(58) Field of Classification Search
CPC ....... H01L 29/42364; H01L 21/823462; H01L 21/28158; H01L 21/76224
See application file for complete search history.

(56) References Cited

U.S. PATENT DOCUMENTS

| 2011/0049585 | A1* | 3/2011 | Beyer | H01L 21/0206 257/288 |
| 2013/0181287 | A1* | 7/2013 | Zhang | H01L 21/26506 257/335 |
| 2015/0097252 | A1* | 4/2015 | Flachowsky | H01L 29/517 257/410 |

\* cited by examiner

*Primary Examiner* — Dale E Page
*Assistant Examiner* — Long H Le
(74) *Attorney, Agent, or Firm* — McDermott Will & Emery LLP

(57) ABSTRACT

In a method of manufacturing a semiconductor device, an isolation region is formed in a substrate, such that the isolation region surrounds an active region of the substrate in plan view. A first dielectric layer is formed over the active region. A mask layer is formed on a gate region of the first dielectric layer. The gate region includes a region where a gate electrode is to be formed. The mask layer covers the gate region, but does not entirely cover the first dielectric layer. The first dielectric layer not covered by the mask layer is removed such that a source-drain region of the active region is exposed. After that, the mask layer is removed. A second dielectric layer is formed so that a gate dielectric layer is formed. The gate electrode is formed over the gate dielectric layer.

21 Claims, 15 Drawing Sheets

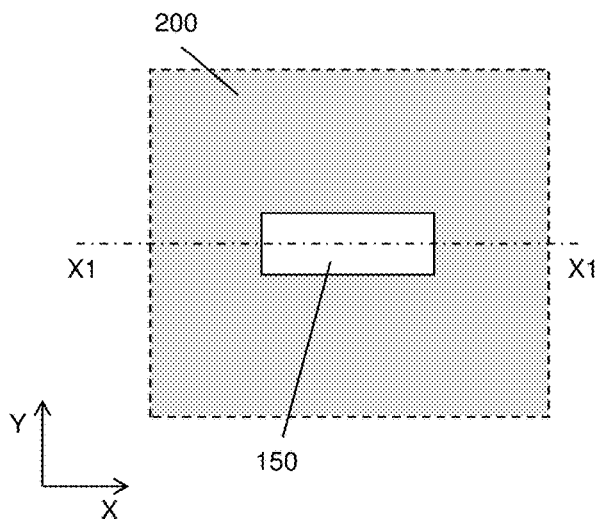
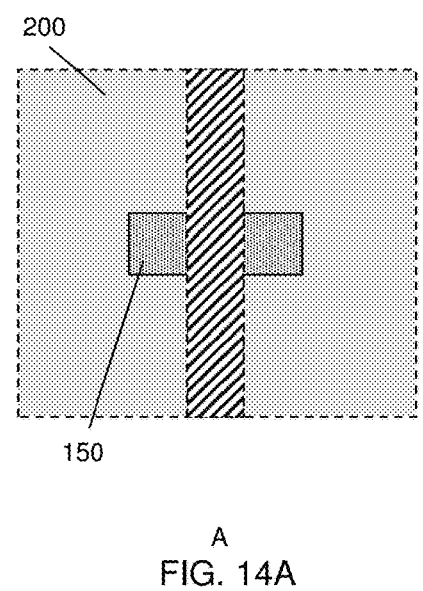
FIG. 13A　　　　　　　　FIG. 14A
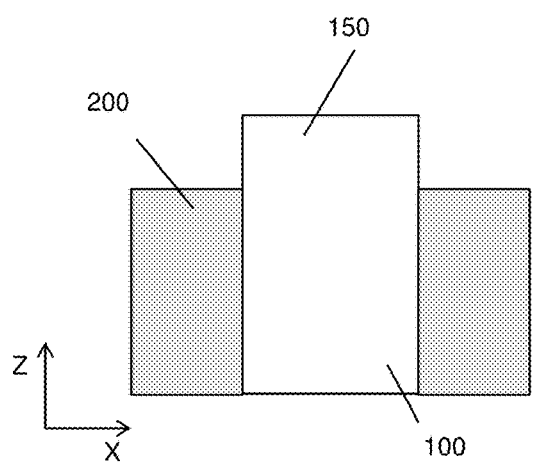
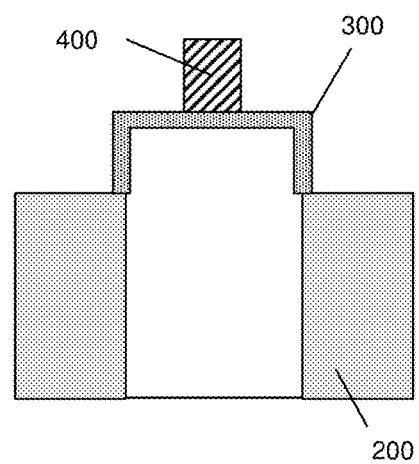
FIG. 13B　　　　　　　　FIG. 14B

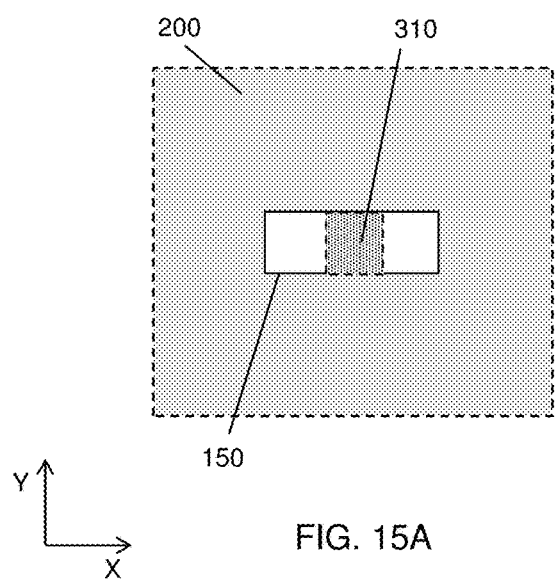
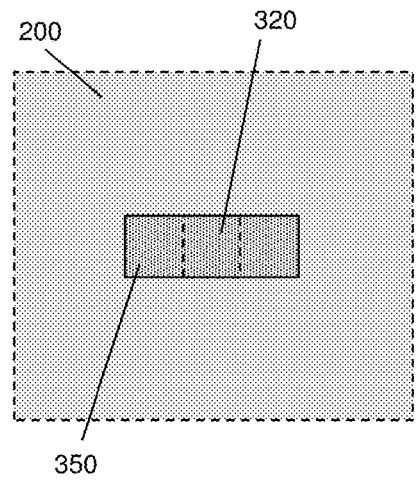
FIG. 15A            FIG. 16A
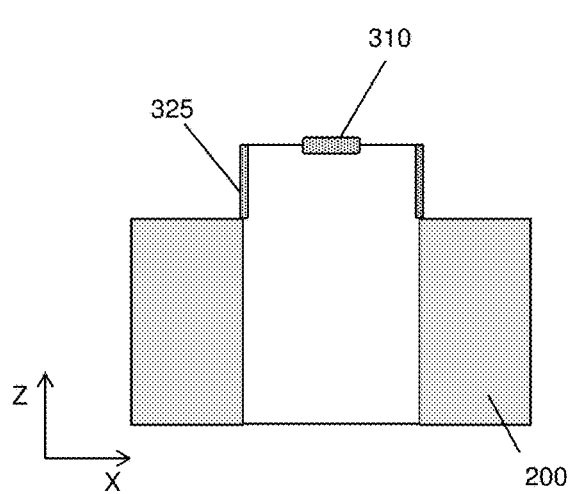
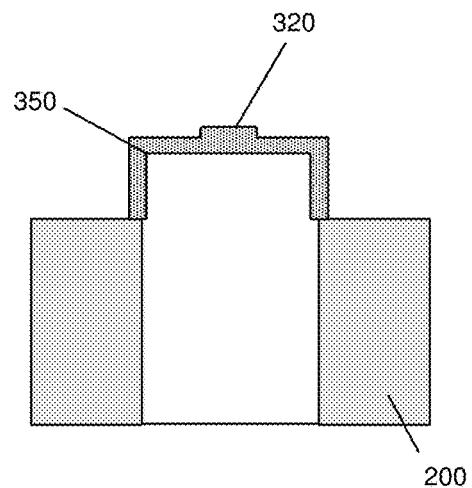
FIG. 15B            FIG. 16B

SEMICONDUCTOR DEVICE AND A METHOD FOR FABRICATING THE SAME

RELATED APPLICATION

This application claims the priority of U.S. Provisional Application No. 62/356,965 filed on Jun. 30, 2016, the entire contents of which application is incorporated herein by reference.

TECHNICAL FIELD

The disclosure relates to a method for manufacturing semiconductor devices, and more particularly to field effect transistors (FETs) having different gate dielectric thicknesses and manufacturing methods therefor.

BACKGROUND

Some semiconductor device such as an embedded flash memory, a high-voltage FET, and bipolar-CMOS-DMOS devices require formation of multiple gate dielectric (gate oxide) layers having different thicknesses. The process for manufacturing multiple gate dielectric (gate oxide) layers includes multiple formations of gate dielectric layers and removal of at least one formed gate dielectric layer. A process that does not affect FET properties is desirable.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 1A-11B show exemplary sequential fabrication processes according to one embodiment of the present disclosure. FIGS. 1A, 2A, . . . 11A are exemplary plan views (viewed from the above) and FIGS. 1B, 2B, . . . 11B are exemplary cross sectional views.

FIGS. 13A-18B show exemplary sequential fabrication processes according to another embodiment of the present disclosure. FIGS. 13A, 14A, . . . 18A are exemplary plan views (viewed from the above) and FIGS. 13B, 14B, . . . 18B are exemplary cross sectional views.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

FIGS. 1A-11B show exemplary sequential fabrication processes according to one embodiment of the present disclosure. It is understood that additional operations can be provided before, during, and after processes shown by FIGS. 1A-11B, and some of the operations described below can be replaced or eliminated, for additional embodiments of the method. The order of the operations/processes may be interchangeable.

Figure 1A:
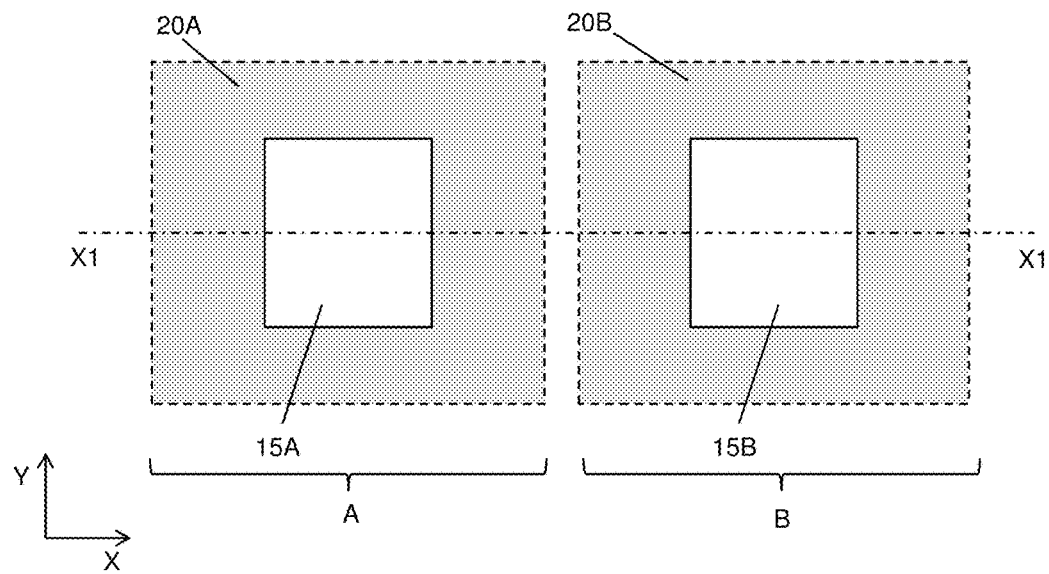
Figure 1B:
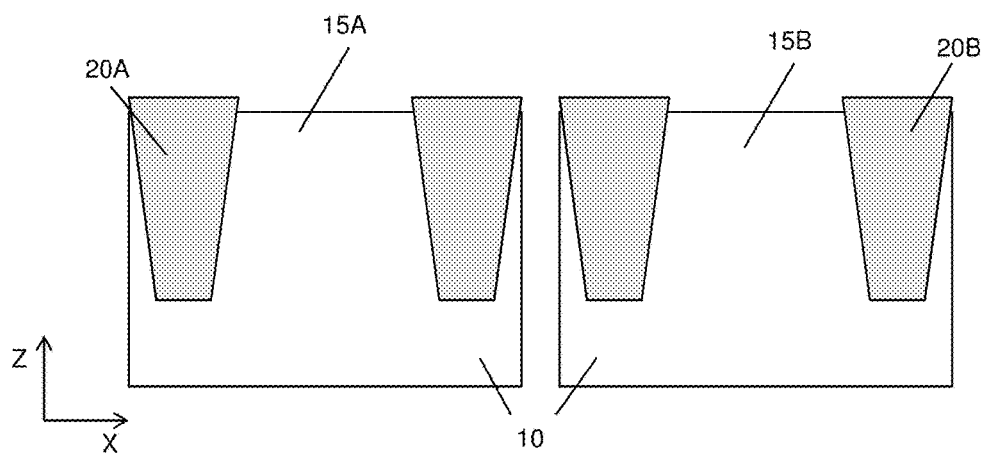
Figure 2A:
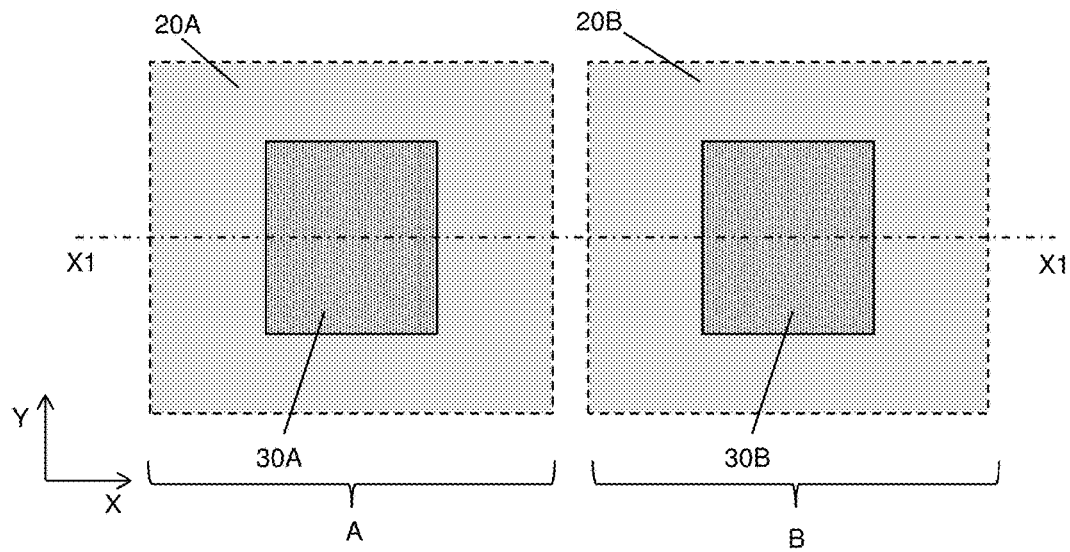
Figure 2B:
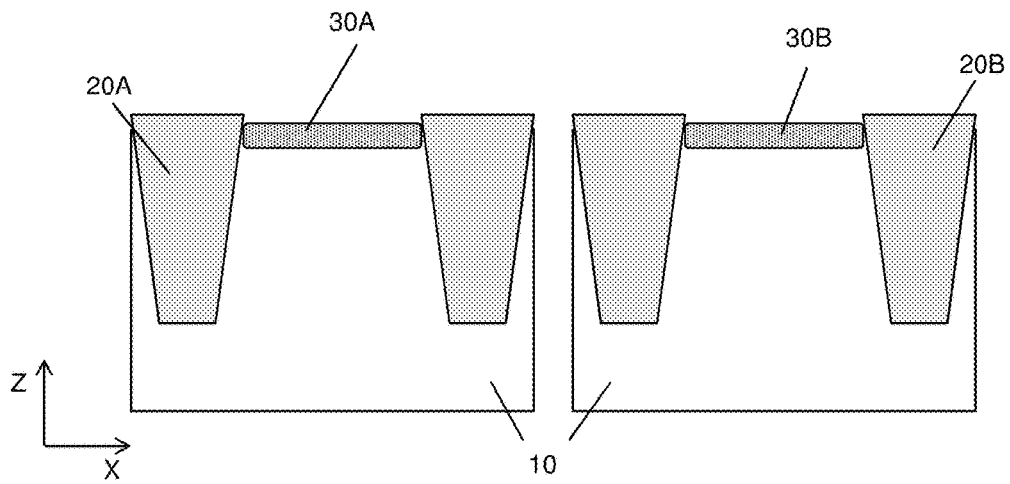

FIG. 1A, 2A, . . . 11A show plan (top) views and FIGS. 1B, 2B, . . . 7B show cross sectional views along line X1-X1 of FIGS. 1A, 2A, . . . 7A, respectively.

In one embodiment of the present disclosure, the semiconductor device includes a first FET formed in a region A and a second FET formed in a region B, as shown in FIGS. 1A and 1B. The regions A and B may be adjacent to each other or may be separated by one or more elements of the semiconductor device. In this embodiment, a gate dielectric layer (e.g., a gate oxide layer) of the first FET is thicker than a gate dielectric layer of the second FET, and thus a threshold voltage of the first FET is higher than that of the second FET.

FIGS. 1A and 1B show a structure after isolation regions 20A and 20B are formed in a substrate 10. The isolation regions (first isolation region 20A and second isolation region 20B) are also called a shallow trench isolation (STI).

The isolation regions 20A and 20B are formed by trench etching the substrate 10 and filling the trenches with an insulating material. The isolation regions are made of, for example, one or more layers of insulating materials such as silicon oxide, silicon oxynitride or silicon nitride, formed by LPCVD (low pressure chemical vapor deposition), plasma-CVD or flowable CVD. In the flowable CVD, flowable dielectric materials instead of silicon oxide are deposited. Flowable dielectric materials, as their name suggest, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TCPS), a perhydro-polysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove un-desired element(s) to form silicon oxide. When the un-desired element(s) is removed, the flowable film densifies and shrinks. In some embodiments, multiple anneal processes are conducted. The flowable film is cured and annealed more than once. The flowable film may be doped with boron and/or phosphorous. The isolation regions may be formed by one or more layers of SOG, SiO, SiON, SiOCN and/or fluorine-doped silicate glass (FSG) in some embodiments.

The substrate 10 is silicon substrate in one embodiment, and is appropriately doped. The substrate 10 may comprise another elementary semiconductor, such as germanium; a compound semiconductor including Group IV-IV compound semiconductors such as SiC and SiGe, Group III-V compound semiconductors such as GaAs, GaP, GaN, InP, InAs, InSb, GaAsP, AlGaN, AlInAs, AlGaAs, GaInAs, GaInP, and/or GaInAsP; or combinations thereof.

Portions of the substrate surrounded by the isolation regions 20A and 20B are referred to as active regions (or diffusion regions) 15A and 15B, respectively, in which a channel, a source and a drain of an FET are formed. As shown in FIG. 1B, the upper surfaces of the active regions 15A and 15B are slightly lower than the upper surface of the isolation regions 20A and 20B.

In FIGS. 2A and 2B, a first dielectric layer 30A is formed over the first active region 15A and a second dielectric layer 30B is formed over the second active region 15B. The first and second dielectric layers are formed at the same time. In one embodiment, the first and second dielectric layers 30A and 30B are silicon dioxide which is formed by thermal oxidation. In other embodiments, the first and second dielectric layers are silicon oxide, silicon nitride and/or silicon oxynitride formed by chemical vapor deposition (CVD). A thickness of the first and second dielectric layers is in a range from about 1 nm to about 200 nm in some embodiments, and is in a range from about 10 nm to about 100 nm in other embodiments.

Figure 3A:
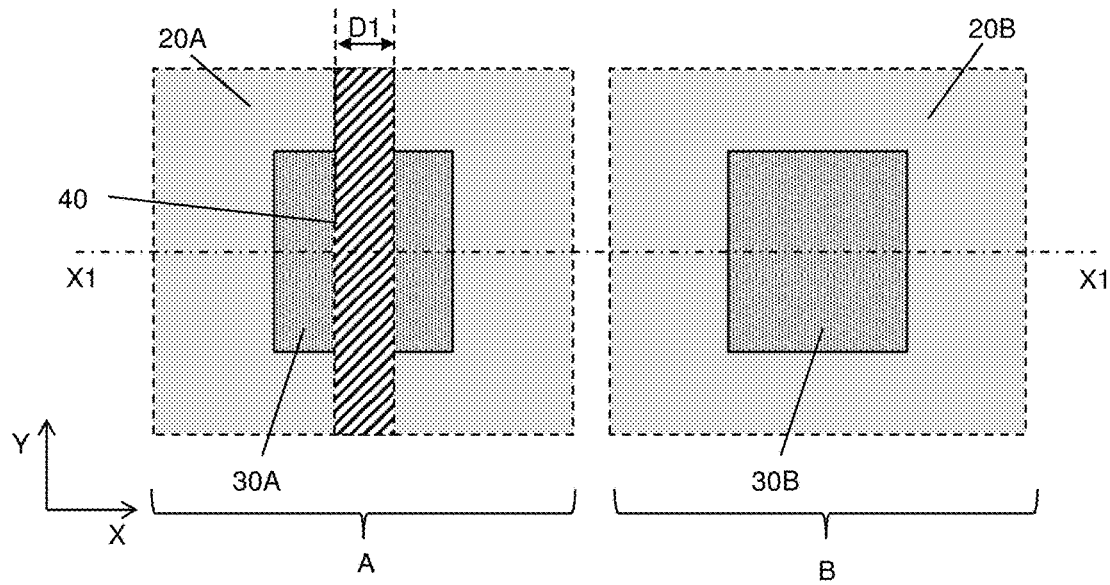
Figure 3B:
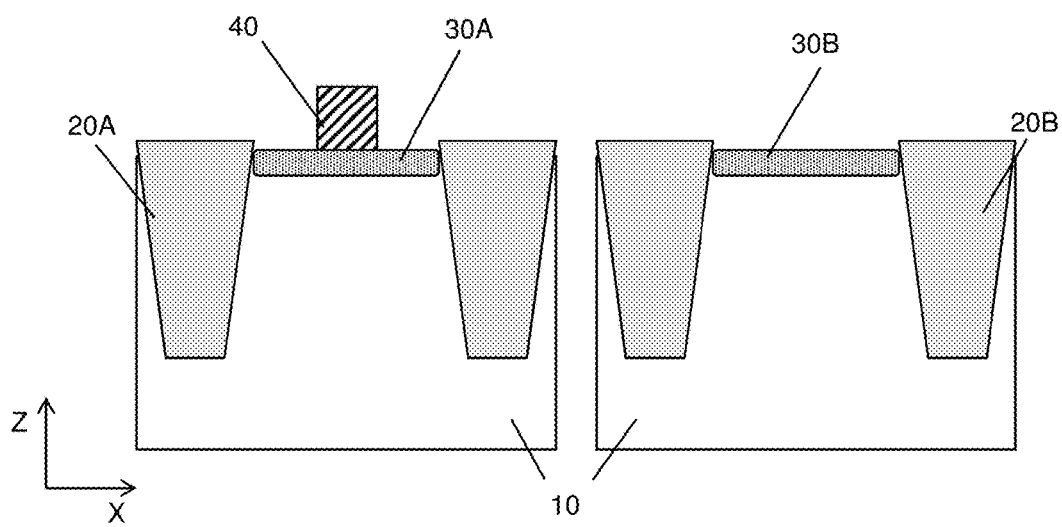

In FIGS. 3A and 3B, a mask layer 40 is formed over the region A. The mask layer 40 is a photo resist pattern formed by a lithography operation. The mask layer 40 is formed over the first active region 15A to cover a portion of the first active region 15A (i.e., a gate region) where a gate electrode is to be formed. In some embodiments, the mask layer 40 is also formed over the isolation region 20A. As shown in FIGS. 3A and 3B, the region B is not covered by a photo resist.

Figure 4A:
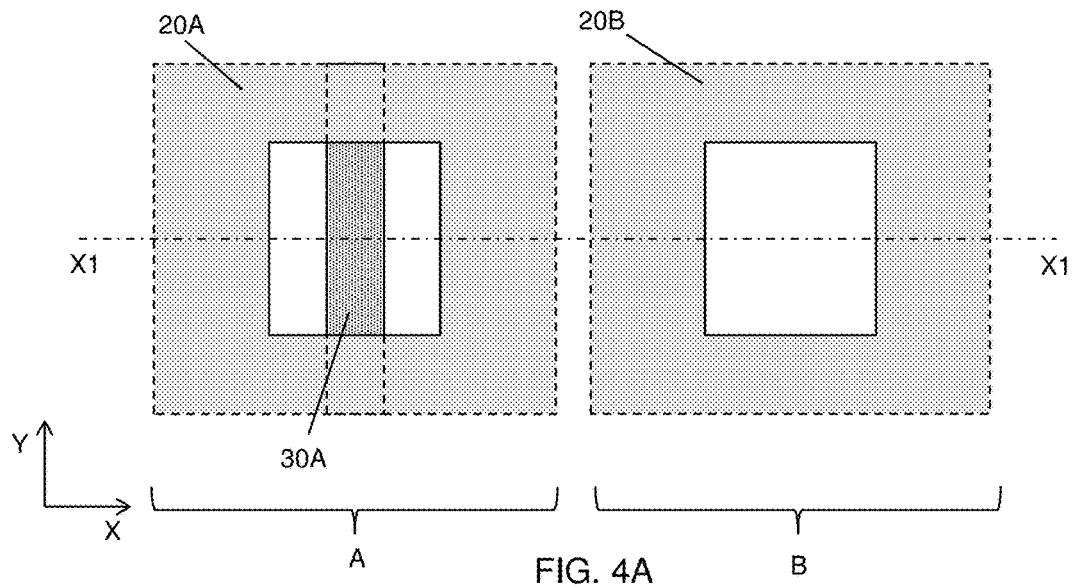
Figure 4B:
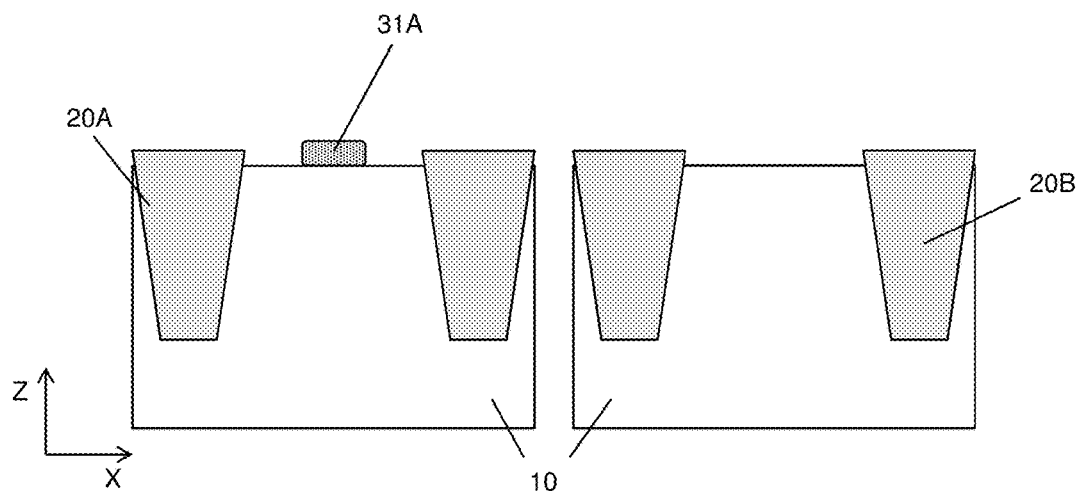

As shown in the later figures, a gate electrode extends in the Y direction of the figures. A width D1 of the mask layer 40 (i.e., the width of the gate region) is greater than a width D2 (see, FIG. 7A or 8A) of the gate electrode of the first FET to be formed in the region A. The width D1 of the mask layer 40 is in a range from about 50 nm to about 100 μm in some embodiments. In some embodiments, the width D1 of the mask layer 40 satisfies $1.0 \times D2 < D1 \leq 2.0 \times D2$, and satisfies $1.1 \times D2 < D1 \leq 1.5 \times D2$ in other embodiments. In certain embodiment, the difference between D1 and D2 is in a range from about 1 nm to about 5000 nm. In other embodiments, the difference is in a range from about 20 nm to about 500 nm As shown in FIGS. 4A and 4B, the first dielectric layer 30A not covered by the mask layer 40 and the second dielectric layer 30B are removed by using, for example, wet etching and/or dry etching. In one embodiment, wet etching with buffered HF or dilute HF is used. As shown in FIG. 4B, the first active region 15A not covered by the mask layer 40 is exposed and a part of the first dielectric layer 31A located under the mask layer 40 remains. The mask layer 40 is removed by an ashing operation and/or a cleaning operation.

Figure 5A:
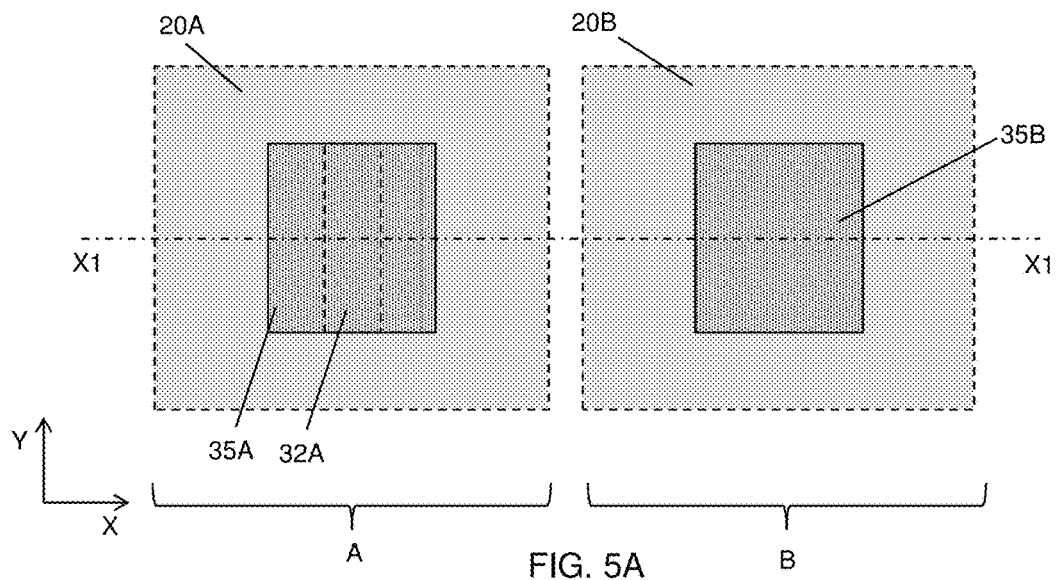
Figure 5B:
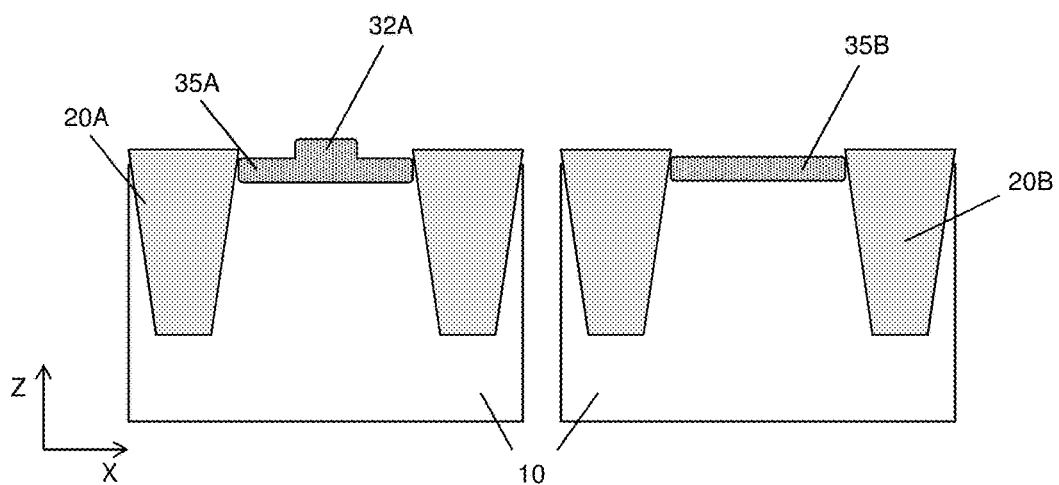
Figure 6A:
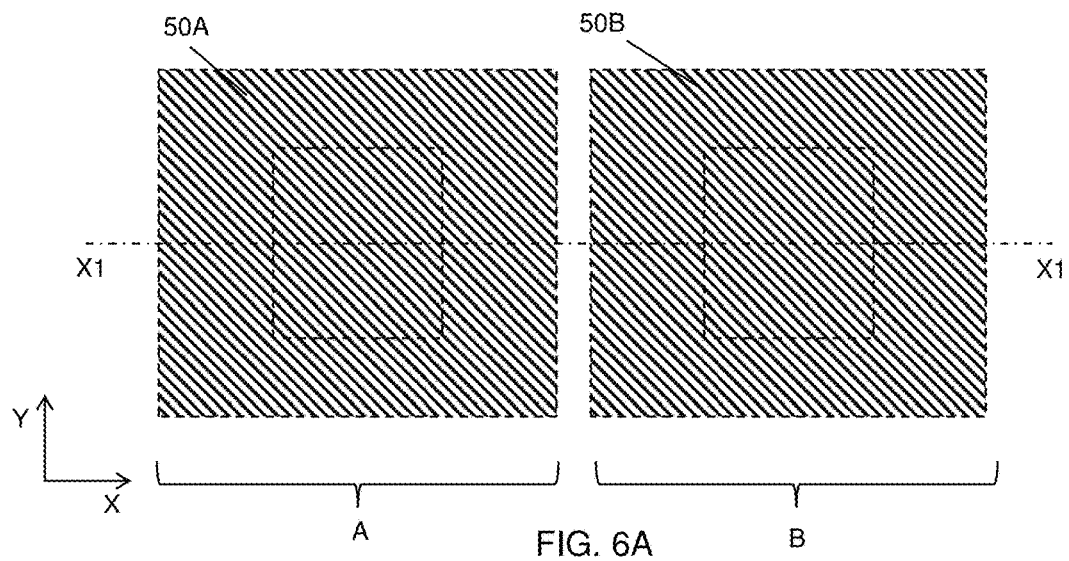
Figure 6B:
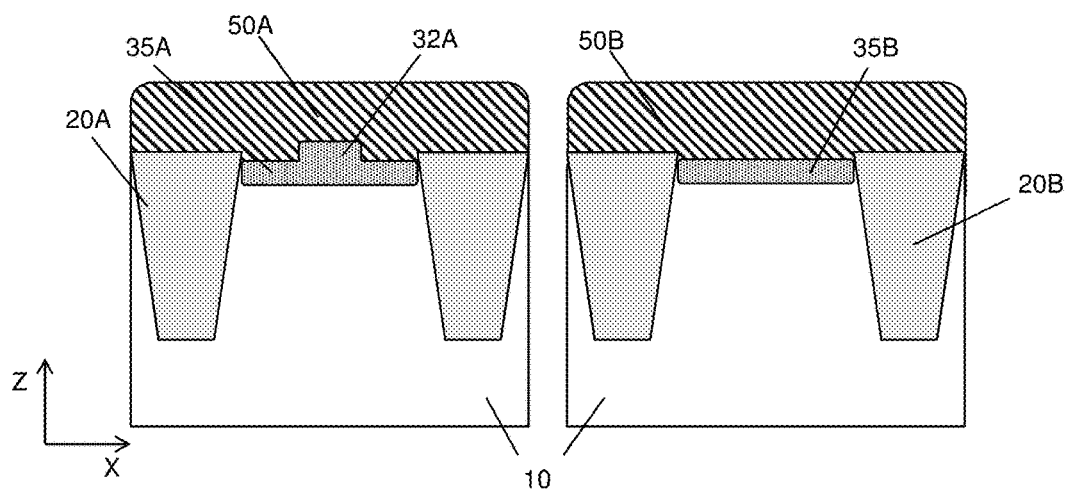

Subsequently, an additional dielectric layer is formed over the first region A and the second region B. A gate dielectric layer 35A is formed in the region A, and a gate dielectric layer 35B is formed in the region B, as shown in FIGS. 5A and 5B. In the region A, a thick gate dielectric layer 32A is formed. A thickness of the gate dielectric layers 35A and 35B is in a range from about 1 nm to about 100 nm in some embodiments, is in a range from about 2 nm to about 10 nm in certain embodiments, and is in a range from about 2 nm to about 5 nm in other embodiments. A thickness of the thick gate dielectric layer 32A is in a range from about 5 nm to about 200 nm in some embodiments, and is in a range from about 10 nm to about 100 nm in other embodiments.

In one embodiment, the additional dielectric layer is silicon dioxide which is formed by thermal oxidation. In other embodiments, the additional dielectric layer is silicon oxide, silicon nitride and/or silicon oxynitride formed by chemical vapor deposition (CVD).

After the gate dielectric layers are formed, a conductive material 50A and 50B are formed over the first and second regions, respectively. In one embodiment, the conductive material is poly-silicon with appropriate dopant, which is formed by CVD. A thickness of the poly-silicon layers 50A and 50B is in a range from about 10 nm to about 1000 nm in some embodiments.

Figure 7A:
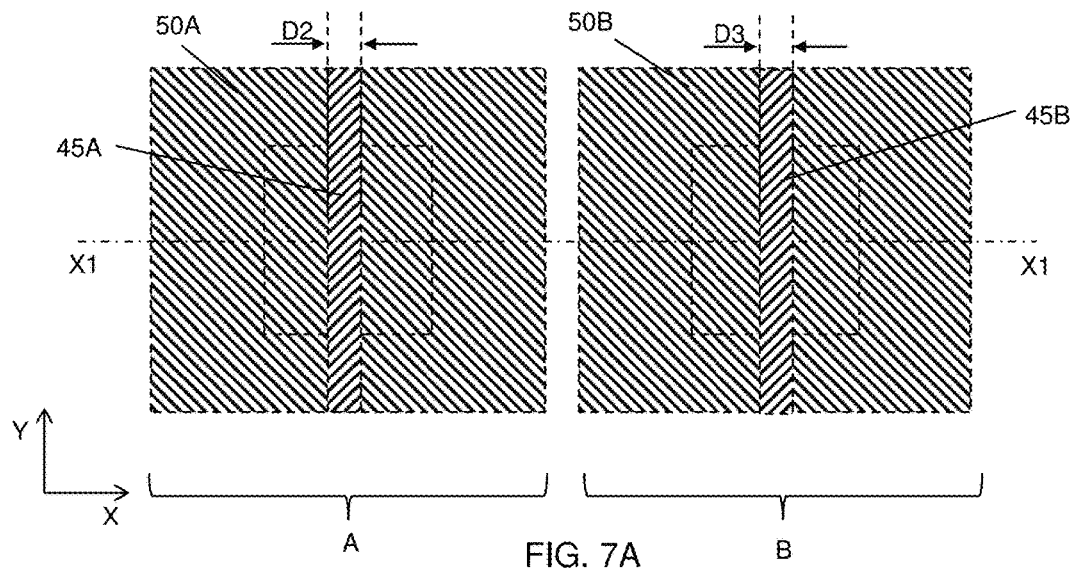
Figure 7B:
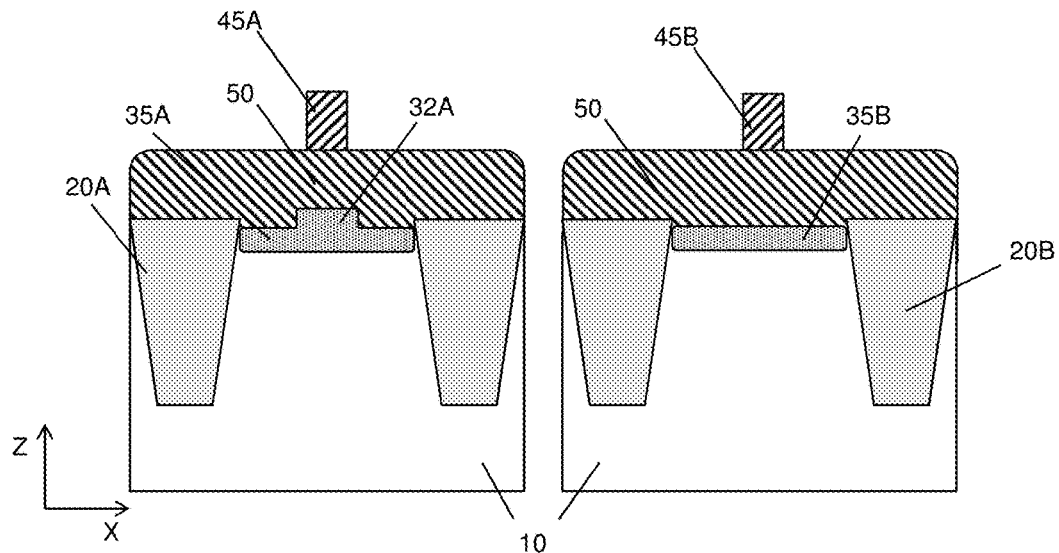

After the conductive material is formed, gate mask patterns 45A and 45B are formed over the conductive material layer in the regions A and B, respectively, as shown in FIGS. 7A and 7B. The gate mask patterns are a photo resist pattern formed by a lithography operation. A width D2 and D3 of the gate mask patterns are in a range from about 10 nm to about 100 μm in some embodiments. In certain embodiments, D2 is greater than D3, and in other embodiments D2 is equal to or smaller than D3.

Figure 8A:
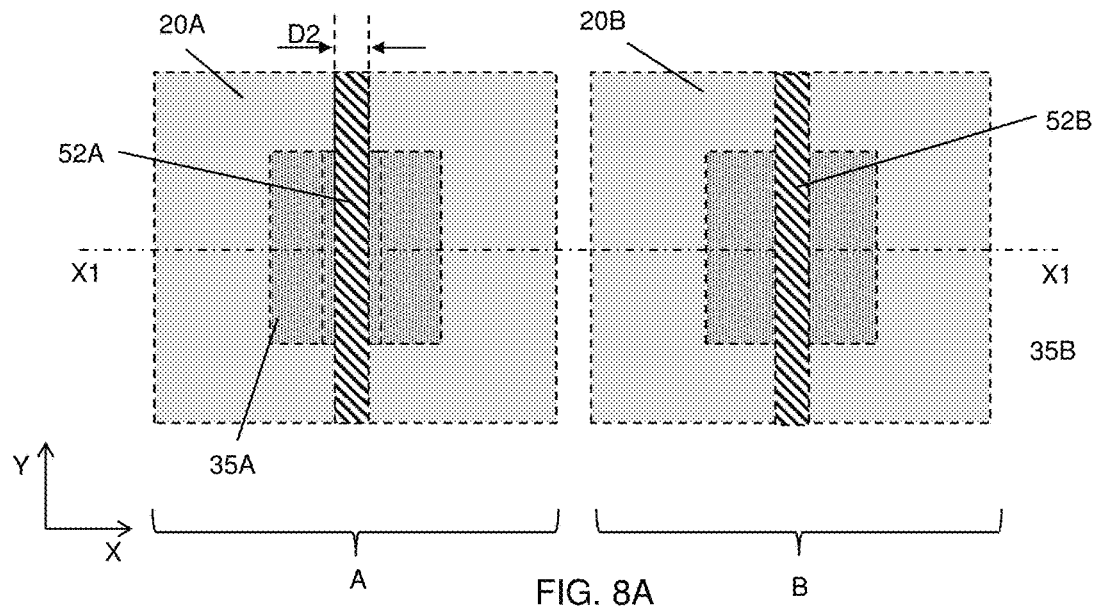
Figure 8B:
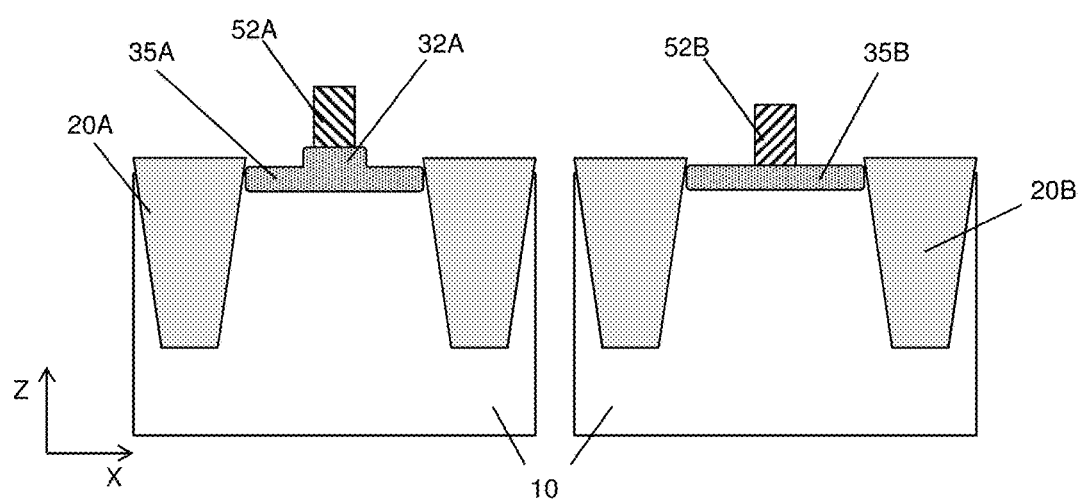

By using the gate mask patterns as etching masks, the conductive material layer (e.g., poly-silicon layer) 50A and 50B are patterned into first and second gate electrodes 52A and 52B, respectively, as shown in FIGS. 8A and 8B. As shown in FIG. 8A, the first and second gate electrodes extend in the Y direction. Of course, at least one of the first and second gate electrodes may extend in the X direction.

In certain embodiments, the conductive material layer 50A and 50B is patterned by using a hard mask including a silicon dioxide layer and/or a silicon nitride layer. The hard mask layer is formed over the conductive material layer and patterned by using a photo resist pattern.

Figure 9A:
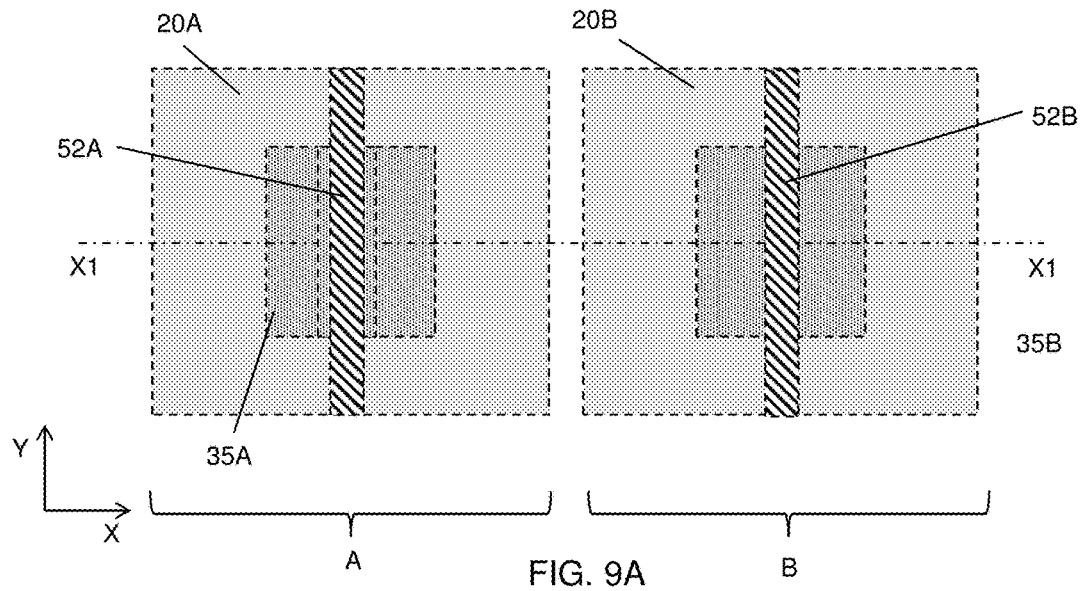
Figure 9B:
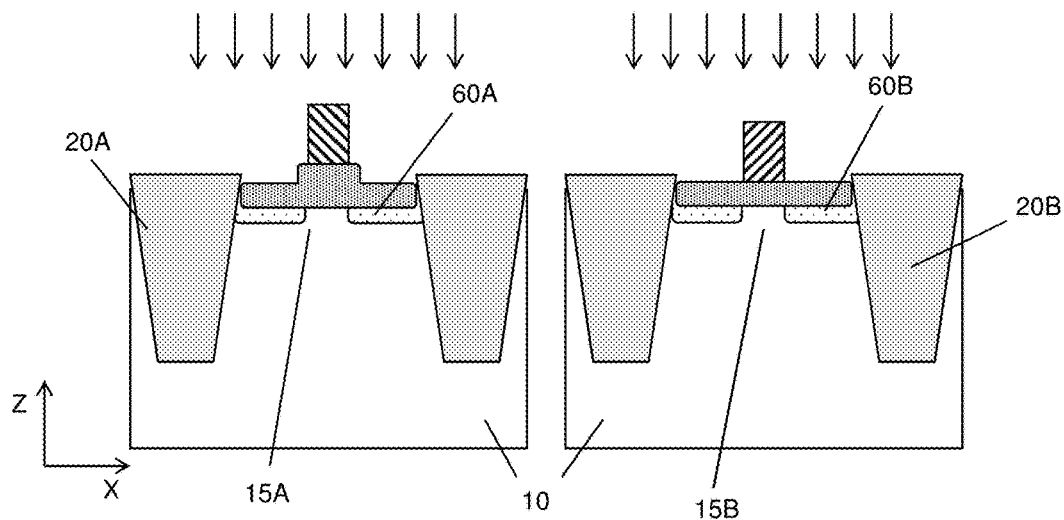

After the gate electrodes are formed, an LDD (lightly-doped drain) implantation is performed as shown in FIG. 9B. One or more dopants (impurities), such as B, $BF_2$, P and As, are ion-implanted to the active regions 15A and 15B through the gate dielectric layers. The acceleration energy is in a range from about 30 keV to about 100 keV, and the dose amount (dosage) is in a range from about $1 \times 10^{12}$ $cm^{-2}$ to about $1 \times 10^{15}$ $cm^{-2}$, in some embodiments. By the LDD implantation, LDD regions 60A and 60B are formed in the regions A and B, respectively.

Figure 10A:
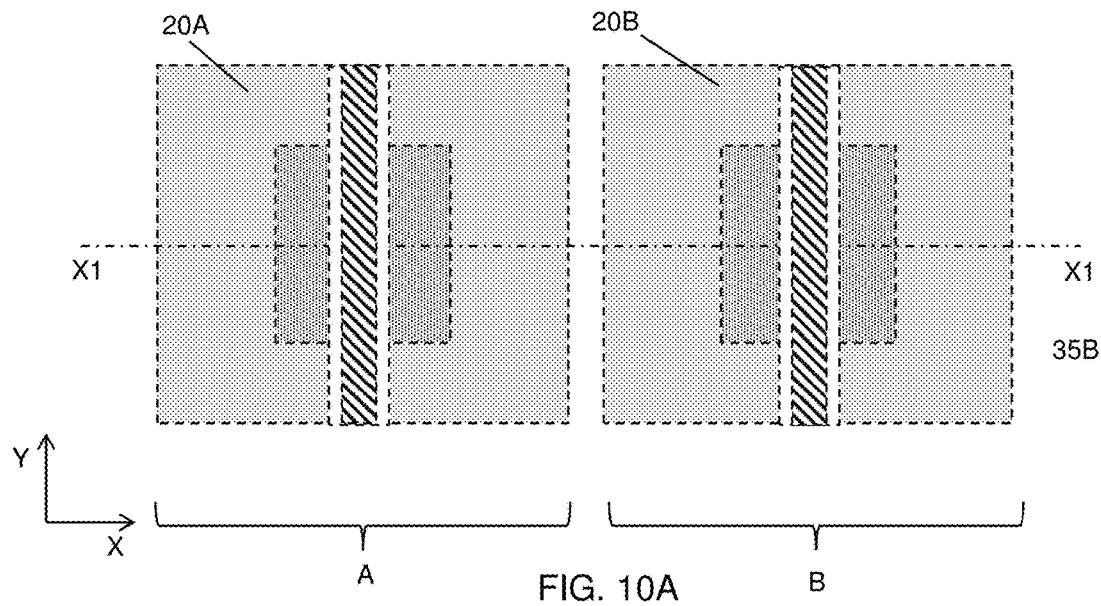
Figure 10B:
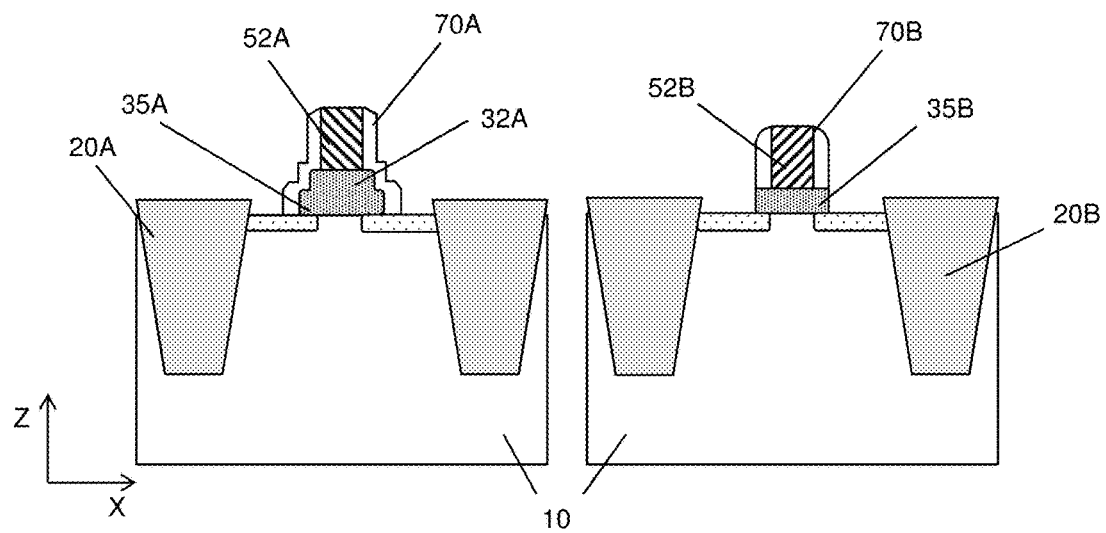

After the LDD implantation, sidewall spacers 70A and 70B are formed, as shown in FIGS. 10A and 10B. One or more blanket layers of a dielectric material, such as silicon oxide, silicon nitride and/or silicon oxynitride, are formed over the structures shown in FIGS. 9A and 9B, and anisotropic etching is performed. A thickness of the sidewall spacers 70A and 70B is in a range from about 5 nm to about 200 nm in some embodiments. After the sidewall spacers are formed, a thin oxide layer with a thickness of 0.5 nm to 1.0 nm may exist on the active regions not covered by the gate electrodes and the sidewall spacers.

Figure 11A:
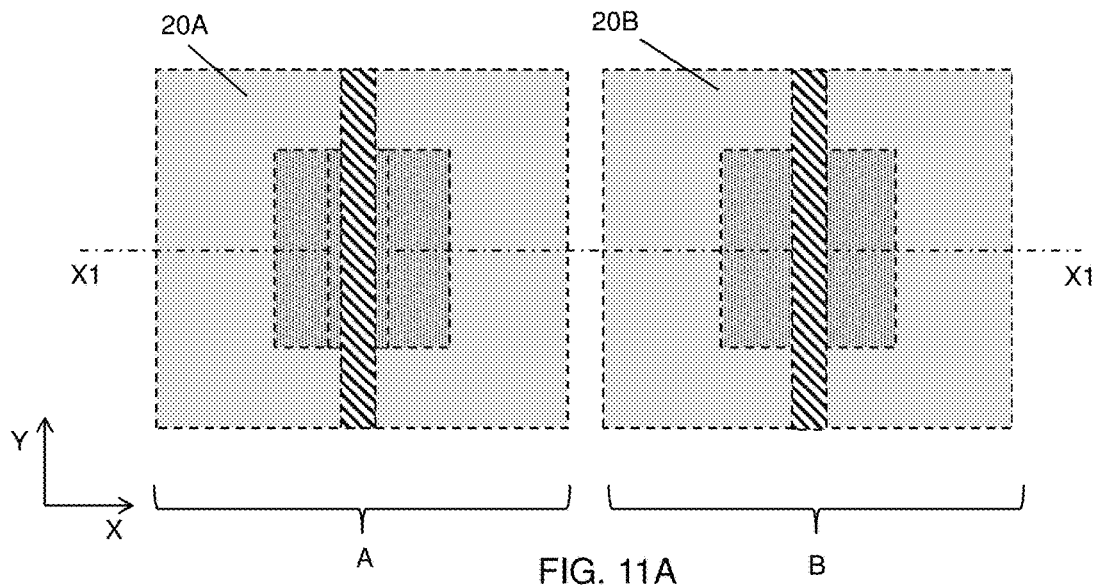
Figure 11B:
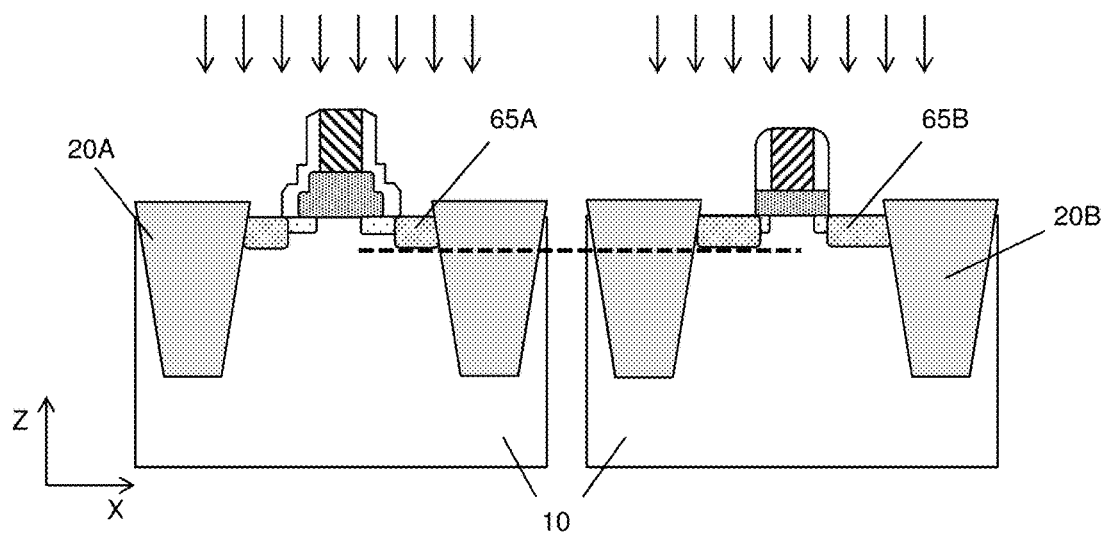

After the sidewall spacers are formed, a source-drain (S/D) ion implantation is performed to form S/D regions 65A and 65B, as shown in FIGS. 11A and 11B. The acceleration energy is in a range from about 1 keV to about 50 keV, and the dose amount (dosage) is in a range from about $1\times10^{13}$ cm$^{-2}$ to about $5\times10^{16}$ cm$^{-2}$, in some embodiments.

As shown in FIG. 11B, the depth of the S/D doped regions (junction depth) for the first FET in the region A and for the second FET in the region B is substantially the same.

Figure 12:
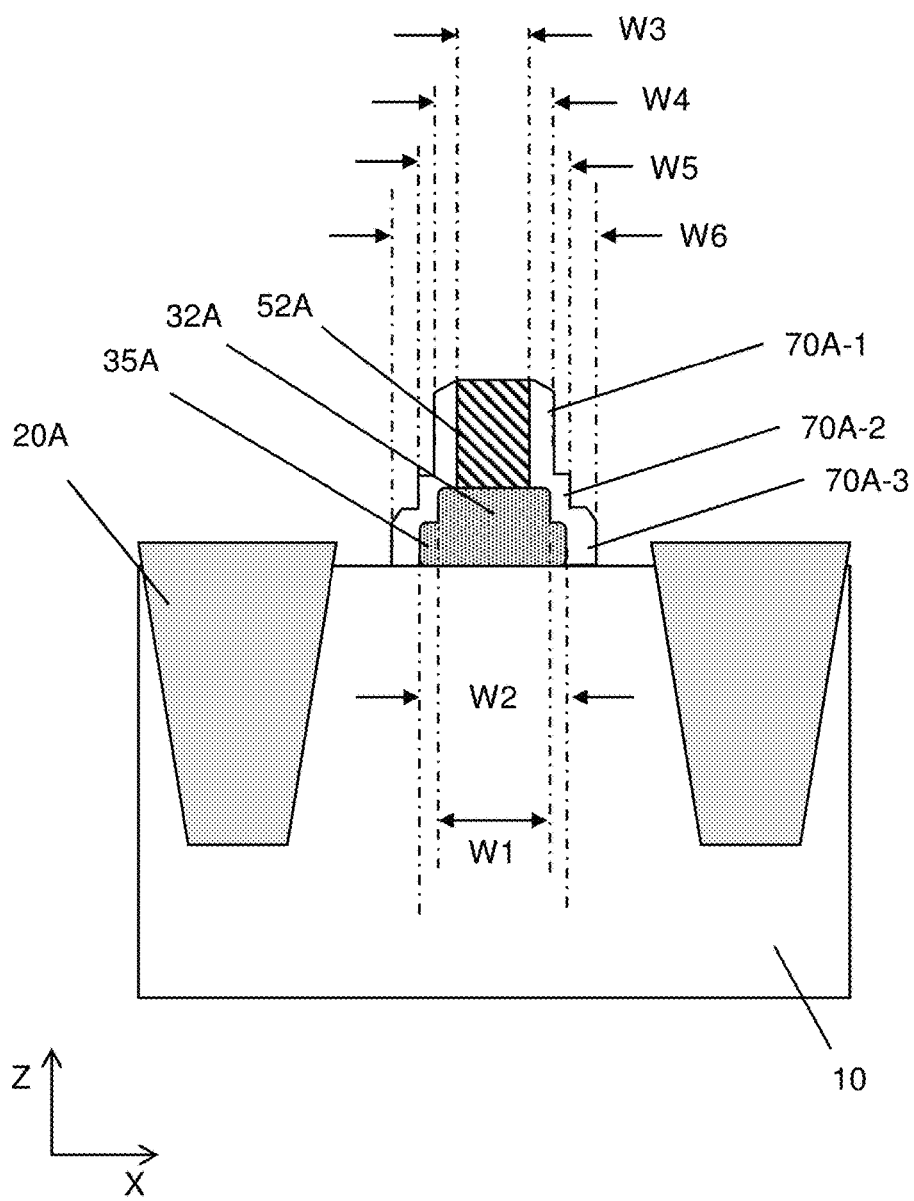
FIG. 12 shows an exemplary cross sectional view illustrating the structure after a source and a drain are formed according to one embodiment of the present disclosure.

FIG. 12 shows an exemplary cross sectional view of the first FET having a thick gate dielectric layer. The gate dielectric layer includes a thick region 32A and a thin region 35A as shown in FIG. 12. A width W1 of the thick region 32A is smaller than a width W2 of the thin region 35A. The different between W1 and W2 is in a range from about 20 nm to about 500 nm in some embodiments.

As shown in FIG. 12, a width W3 of the gate electrode 52A is smaller than the width W1 of the thick region 32A. A width W4 is a total of the width W3 of the gate electrode and the sidewall spacers 70A-1 formed on sidewalls of the gate electrode 52A, a width W5 is a total of the width W2 of the thick region 32A and the sidewall spacers 70A-2 formed on sidewalls of the thick region 32A, and a width W6 is a total of the width W1 of the thin region 35A and the sidewall spacers 70A-3 formed on sidewalls of the thin region 35A, where W3<W4<W5<W6.

After the source-drain implantation is performed, further CMOS fabrication operations, such as forming a silicide layers, forming an interlayer dielectric layer, forming wiring patterns, and etc., are performed.

FIGS. 13A-18B show exemplary sequential fabrication processes according to another embodiment of the present disclosure. It is understood that additional operations can be provided before, during, and after processes shown by FIGS. 13A-18B, and some of the operations described below can be replaced or eliminated, for additional embodiments of the method. The order of the operations/processes may be interchangeable. The same or similar configurations, operations, processes and/or material as those explained with FIGS. 1A-11B are employed in this embodiment, and the detailed explanation thereof may be omitted. FIGS. 13A, 14A, . . . 18A are exemplary plan views (viewed from the above) and FIGS. 13B, 14B, . . . 18B are exemplary cross sectional views corresponding to line X1-X1 of FIG. 13A.

In the foregoing embodiment, a fabrication process for a planar type FET is explained. In this embodiment, a fin type FET is employed. FIGS. 13A-18B show exemplary sequential fabrication processes for fabricating a fin type FET having a thick gate dielectric layer.

As shown in FIGS. 13A and 13B, a semiconductor fin 150 (active region) is formed by trench etching of the substrate 100, for example, a silicon substrate. The trench is filled with an insulating material to form an isolation region 200. A height of the fin 150 from the surface of the isolation region 200 is in a range from about 20 nm to about 200 nm, and a width of the fin (in the Y direction) is in a range from about 50 nm to about 200 nm, in some embodiments.

As shown in FIGS. 14A and 14B, a first dielectric layer 300 is formed over the fin 150 and a mask pattern 400 is formed on the first dielectric layer 300. The mask layer 400 is formed over a gate region where a gate electrode is to be formed. As set forth above, the width of the mask layer (i.e., the gate region) is greater than the width of the gate electrode. The first dielectric layer 300 is a silicon oxide formed by thermal oxidation or CVD.

By using the mask layer 400 as an etching mask, the first dielectric layer 300 is patterned to remove the first dielectric layer not covered by the mask layer 400, by wet etching and/or dry etching, as shown in FIGS. 15A and 15B. After the etching, the remaining dielectric layer 310 is formed in the gate region. When dry etching is used, there may be remaining parts 325 of the first dielectric layer on sidewalls of the fin 150.

Subsequently, a second dielectric layer 350 is formed, as shown in FIGS. 16A and 16B. The second dielectric layer 350 is a silicon oxide formed by thermal oxidation or CVD. By forming the second dielectric layer 350, a thick gate dielectric layer 320 is formed in the gate region. The remaining part of the fin 150 is covered by the second dielectric layer 350 which is thinner than the thick gate dielectric layer 320.

Figure 17A:
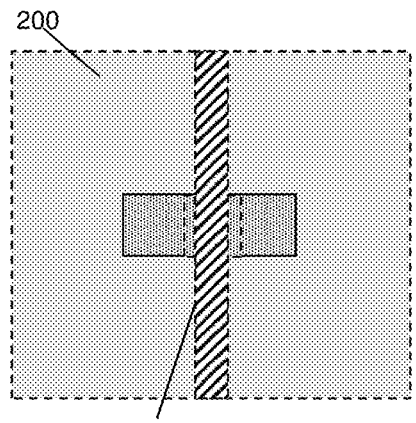
Figure 17B:
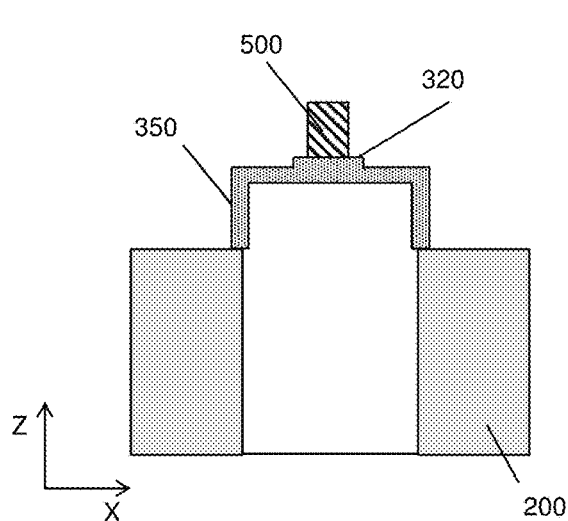

After the second dielectric layer is formed, a gate electrode 500 is formed on the thick gate dielectric layer 320, as shown in FIGS. 17A and 17B.

Figure 18A:
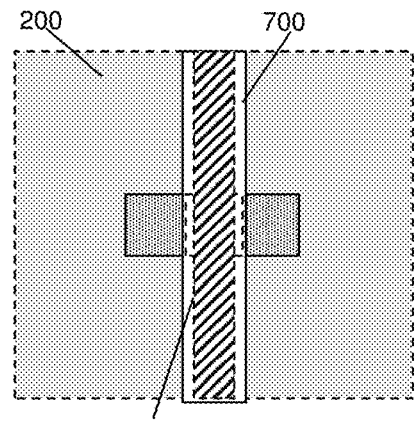
Figure 18B:
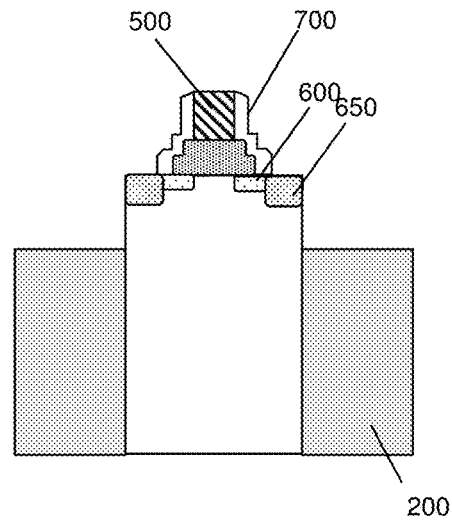

Subsequently, an LDD 600 is formed by ion implantation, and sidewall spacers 700 are formed on sidewalls of the gate electrode 500. Then, source-drain regions 650 are formed by ion implantation, as shown in FIGS. 18A and 18B.

Although not shown in the drawings, a fin type FET having a thin gate dielectric layer can also be formed at the same time as the fin type FET having a thick gate dielectric layer. The thickness of the thin gate dielectric layer is substantially the same as that of the dielectric layer 350.

In the foregoing embodiments, a mask layer (40 or 400) is formed only on the gate regions and does not cover the entirety of the active region (15A or 150). If the mask layer entirely covers the active region, a dielectric layer having a certain thickness remains on the source-drain regions, which would prevent ions from being appropriately doped. In contrast, in the present embodiment, when source-drain regions are ion-implanted for an FET having a thick gate dielectric layer, there is substantially no oxide layer (or other dielectric layer) in the source-drain regions. Accordingly, it is possible to form source-drain regions having a substantially same junction depth as an FET having a thin gate dielectric layer.

It will be understood that not all advantages have been necessarily discussed herein, no particular advantage is required for all embodiments or examples, and other embodiments or examples may offer different advantages.

According to one aspect of the present disclosure, in a method of manufacturing a semiconductor device, an isolation region is formed in a substrate such that the isolation region surrounds an active region of the substrate in plan view. The isolation region includes an insulating material. A first dielectric layer is formed over the active region. A mask layer is formed on a gate region of the first dielectric layer. The gate region includes a region where a gate electrode is to be formed. The mask layer covers the gate region, but does not entirely cover the first dielectric layer. The first dielectric layer not covered by the mask layer is removed such that a source-drain region of the active region is exposed. After the first dielectric layer is removed, the mask layer is removed. A second dielectric layer is formed so that a gate dielectric layer is formed. The gate electrode is formed over the gate dielectric layer.

According to another aspect of the present disclosure, in a method of manufacturing a semiconductor device including a first field effect transistor (FET) and a second FET, an isolation region is formed in a substrate such that the isolation region surrounds a first active region of the substrate for the first FET and a second active region of the substrate for the second FET in plan view. The isolation region includes an insulating material. A first silicon oxide layer is formed over the first and second active regions by thermal oxidation. A mask layer is formed over a gate region of the first silicon oxide layer formed over the first active region. The gate region includes a region where a first gate electrode of the first FET is to be formed. The mask layer covers the gate region, but does not entirely cover the first silicon oxide layer formed over the first active region, and no mask layer is formed over the second active region. The first silicon oxide layer not covered by the mask layer is removed in the first active region, and the first silicon oxide layer is removed in the second active region. The mask layer is removed. After the mask layer is removed, a second silicon oxide layer is formed by thermal oxidation so that a first gate dielectric layer for the first FET and a second gate dielectric layer for the second FET are formed. A first gate electrode is formed over the first gate dielectric layer for the first FET and a second gate electrode is formed over the second gate dielectric layer for the second FET. The first gate dielectric layer includes a first region and a second region having a thickness greater than the first region. The second gate dielectric layer has a same thickness as the first region of the first gate dielectric layer.

In accordance with yet another aspect of the present disclosure, a semiconductor device includes an active region including a channel, a source and a drain; an isolation region surrounding the active region; a gate dielectric layer disposed on the channel; and a gate electrode disposed over the channel. The gate dielectric layer includes a first region and a second region having a thickness greater than the first region. The gate electrode is formed over the second region. A width of the second region is greater than a width of the first region.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
   forming an isolation region in a substrate such that the isolation region surrounds an active region of the substrate in plan view, the isolation region including an insulating material;
   forming a first dielectric layer over the active region;
   forming a mask layer on a gate region of the first dielectric layer, the gate region including a region where a gate electrode is to be formed, the mask layer covering the gate region, but does not entirely cover the first dielectric layer;
   removing the first dielectric layer not covered by the mask layer such that source-drain regions of the active region are exposed;
   after removing the first dielectric layer not covered by the mask layer, removing the mask layer;
   forming a second dielectric layer so that a gate dielectric layer is formed; and
   forming the gate electrode over the gate dielectric layer.

2. The method of claim 1, wherein the gate dielectric layer includes a first region and a second region having a thickness greater than the first region.

3. The method of claim 2, wherein a width of the first region is greater than a width of the second region.

4. The method of claim 2, wherein the gate electrode is disposed over the second region.

5. The method of claim 1, wherein the second dielectric layer is formed over the source-drain regions and the gate region.

6. The method of claim 1, wherein the removing the first dielectric layer is performed by wet etching.

7. The method of claim 1, wherein the first and second dielectric layers are formed by thermal oxidation.

8. The method of claim 1, further comprising:
   implanting first ions into the source-drain regions after the gate electrode is formed;
   after the first ions are implanted, forming sidewall spacers on sidewalls of the gate electrode; and
   after the sidewall spacers are formed, implanting second ions into the source-drain regions.

9. The method of claim 8, wherein the gate dielectric layer includes a first region and a second region having a thickness greater than the first region, and the sidewall spacers cover sidewalls of the first region and the second region of the gate dielectric layer.

10. The method of claim 1, wherein a width of the mask layer is greater than a width of the gate electrode.

11. A method of manufacturing a semiconductor device including a first field effect transistor (FET) and a second FET, the method comprising:
    forming an isolation region in a substrate such that the isolation region surrounds a first active region of the substrate for the first FET and a second active region of the substrate for the second FET in plan view, the isolation region including an insulating material;
    forming a first silicon oxide layer over the first and second active regions by thermal oxidation;
    forming a mask layer over a gate region of the first silicon oxide layer formed over the first active region, the gate region including a region where a first gate electrode of the first FET is to be formed, the mask layer covering the gate region, but does not entirely cover the first silicon oxide layer formed over the first active region, wherein no mask layer is formed over the second active region;
    removing the first silicon oxide layer not covered by the mask layer in the first active region, and the first silicon oxide layer in the second active region;
    removing the mask layer;
    after the mask layer is removed, forming a second silicon oxide layer by thermal oxidation so that a first gate dielectric layer for the first FET and a second gate dielectric layer for the second FET are formed; and
    forming the first gate electrode over the first gate dielectric layer for the first FET and a second gate electrode over the second gate dielectric layer for the second FET, wherein:
    the first gate dielectric layer includes a first region and a second region having a thickness greater than the first region, and
    the second gate dielectric layer has a same thickness as the first region of the first gate dielectric layer.

12. The method of claim 11, wherein a width of the first region is greater than a width of the second region.

13. The method of claim 11, wherein the first gate electrode is disposed over the second region.

14. The method of claim 11, wherein the removing the first silicon dioxide layer is performed by wet etching.

15. The method of claim 11, further comprising:
implanting first ions into source-drain regions of the first FET and the second FET after the first and second gate electrodes are formed;
after the first ions are implanted, forming sidewall spacers on sidewalls of the first and second gate electrodes; and
after the sidewall spacers are formed, implanting second ions into the source-drain regions of the first FET and the second FET.

16. The method of claim 15, wherein a junction depth of the source-drain regions of the first FET is the same as a junction depth of the source-drain regions of the second FET.

17. The method of claim 11, wherein a width of the mask layer is greater than a width of the first gate electrode.

18. The method of claim 11, wherein the mask layer is formed of a photo resist.

19. A semiconductor device comprising:
an active region including a channel, a source and a drain;
an isolation region surrounding the active region;
a gate dielectric layer disposed on the channel;
a gate electrode disposed over the channel; and
first and second sidewall spacers disposed on sidewalls of the gate electrode and the gate dielectric layer, wherein:
the gate dielectric layer includes a first region, a second region, and a third region,
the first and third regions are disposed on opposite sides of the second region,
the second region protrudes from the first and third regions, and has a thickness greater than a thickness of the first region and a thickness of the third region,
the gate electrode is formed over the second region, and
the first sidewall spacer has a step structure and is in direct contact with the first and second regions of the gate dielectric layer, and the second sidewall spacer has a step structure and is in direct contact with the second and third regions of the gate dielectric layer.

20. The semiconductor device of claim 19, wherein a width of the gate electrode is smaller than a width of the second region.

21. The semiconductor device of claim 19, wherein the first second, and third regions are made of a same dielectric material.

* * * * *